(12) United States Patent
Bridgers

(10) Patent No.: US 11,281,830 B2
(45) Date of Patent: Mar. 22, 2022

(54) METHOD AND APPARATUS FOR PERFORMING PROFILE GUIDED OPTIMIZATION FOR FIRST IN FIRST OUT SIZING

(71) Applicant: Intel Corporation, Santa Clara, CA (US)

(72) Inventor: Kenneth Vincent Bridgers, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 462 days.

(21) Appl. No.: 16/298,852

(22) Filed: Mar. 11, 2019

(65) Prior Publication Data
US 2019/0205490 A1 Jul. 4, 2019

(51) Int. Cl.
*G06F 30/23* (2020.01)
*G06F 30/33* (2020.01)
*G06F 8/41* (2018.01)
*G06F 30/331* (2020.01)

(52) U.S. Cl.
CPC ............... *G06F 30/33* (2020.01); *G06F 8/41* (2013.01); *G06F 8/443* (2013.01); *G06F 30/331* (2020.01)

(58) Field of Classification Search
CPC . G06F 30/33; G06F 8/443; G06F 8/41; G06F 30/331; G06F 30/327; G06F 30/3312; G06F 11/30; G06F 13/14; G06F 11/3495; G06F 3/067; H04L 65/4092; H04L 41/145; H04L 43/04; H04L 12/28; H04L 47/12; G01N 29/42
See application file for complete search history.

(56) References Cited

U.S. PATENT DOCUMENTS

| | | | | |
|---|---|---|---|---|
| 5,881,049 | A * | 3/1999 | Beshai | H04Q 11/0478 370/395.21 |
| 6,317,234 | B1 * | 11/2001 | Quayle | H04B 10/272 340/3.51 |
| 7,228,509 | B1 * | 6/2007 | Dada | G06F 30/327 716/102 |
| 7,246,181 | B2 * | 7/2007 | Rosing | G06F 13/14 710/18 |
| 8,930,175 | B1 * | 1/2015 | Fung | G06F 30/3312 703/19 |
| 10,063,496 | B2 * | 8/2018 | Norige | H04L 41/145 |

(Continued)

FOREIGN PATENT DOCUMENTS

| CN | 1262836 A | * | 8/2000 | ............. H04L 12/28 |
|---|---|---|---|---|
| CN | 101131713 A | * | 2/2008 | |

(Continued)

*Primary Examiner* — Kandasamy Thangavelu

(57) ABSTRACT

A method for designing a system on a target device includes generating a hardware description language (HDL) representation of profile data collecting hardware for a HDL of the system during a high-level compilation to collect profile data that includes an arrival rate associated with data transmitted to a buffer and a service rate of a service node associated with the buffer. The HDL of the system is compiled to generate a data file that describes a synthesis, placement and routing of the system on the target device. The target device is programmed with the data file to physically transform components on the target device to implement the system.

22 Claims, 13 Drawing Sheets

(56) References Cited

U.S. PATENT DOCUMENTS

| | | | |
|---|---|---|---|
| 10,558,437 B1 * | 2/2020 | Denisenko | G06F 30/327 |
| 2007/0067096 A1 * | 3/2007 | Ohkubo | G01C 21/28 |
| | | | 701/504 |
| 2007/0283305 A1 * | 12/2007 | Reddy | G06F 1/10 |
| | | | 716/113 |
| 2016/0164788 A1 * | 6/2016 | Goel | H04L 65/4092 |
| | | | 709/228 |
| 2017/0206125 A1 * | 7/2017 | Takeshima | G06F 11/30 |

FOREIGN PATENT DOCUMENTS

| | | | | |
|---|---|---|---|---|
| CN | 103238302 A | * | 8/2013 | H04L 47/12 |
| CN | 107851122 A | * | 3/2018 | G06F 3/067 |
| CN | 108243032 A | * | 7/2018 | H04L 43/04 |
| CN | 108717081 A | * | 10/2018 | G01N 29/42 |
| JP | 2013153245 A | * | 8/2013 | Y02D 30/70 |
| WO | WO 2015182629 A1 | * | 12/2015 | G06F 11/3495 |

* cited by examiner

METHOD AND APPARATUS FOR PERFORMING PROFILE GUIDED OPTIMIZATION FOR FIRST IN FIRST OUT SIZING

FIELD

Embodiments of the present disclosure relate to tools for designing systems on target devices. More specifically, embodiments of the present disclosure relate to a method and apparatus for performing profile guided optimization for first in first out sizing.

BACKGROUND

Target devices such as field programmable gate arrays (FPGAs), structured application specific integrated circuits (ASICs), and ASICs are used to implement large systems that may include million of gates and megabits of embedded memory. The complexity of a large system often requires the use of electronic design automation (EDA) tools to create and optimize a design for the system onto physical target devices.

Among the procedures performed by EDA tools in a computer aided design (CAD) compilation flow are high-level compilation and hardware description language (HDL) compilation. High-level compilation (or "high-level synthesis") involves generating an HDL of a system from a computer language description of the system. The computer language description of the system may be, for example, in Open Computing Language (OpenCL) format or another computer language description format. OpenCL is a framework for writing programs that execute across heterogeneous platforms. OpenCL includes a language for writing kernels and application programming interfaces (APIs) that are used to define and control platforms. HDL compilation involves performing synthesis, placement, routing, and timing analysis of the system on the target device.

Traditionally, high-level synthesis is performed independent of information from other compilations. As a result, the HDL compiler must compile the generated HDL from the high-level compilation in a vacuum in the best manner it can.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

DETAILED DESCRIPTION

Figure 1A:
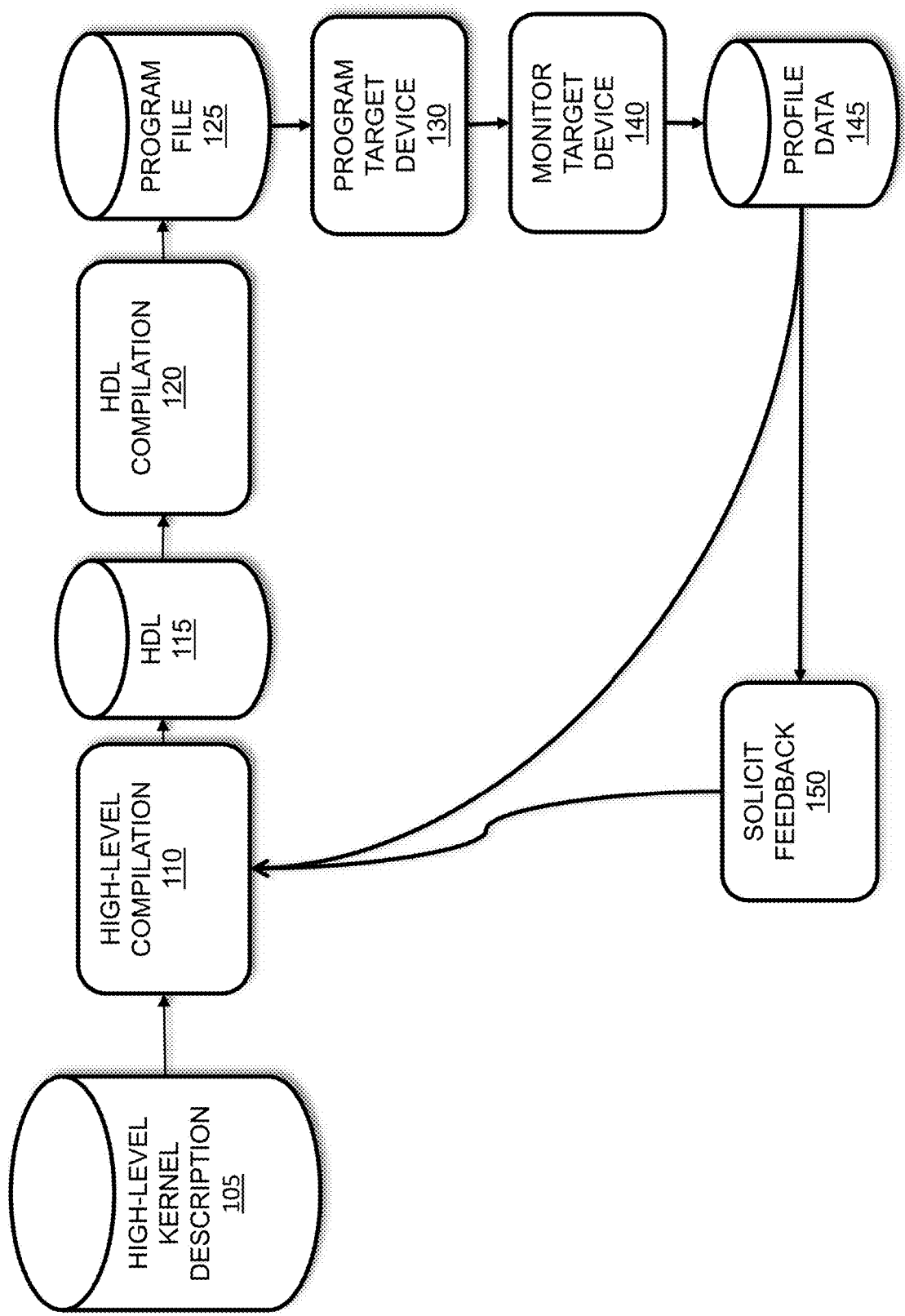
FIG. 1A is a flow chart illustrating a method for designing a system on a target device according to an exemplary embodiment of the present disclosure.

In the following description, for purposes of explanation, specific nomenclature is set forth to provide a thorough understanding of embodiments of the present disclosure. It will be apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

CAD/EDA tools generate communication channels between kernels, and between kernels and input/output (I/O) connections. I/O buffers are implemented for storing data in transactions as transactions may stall. Buffers may be sized by the CAD/EDA tools for paths that have deterministic latencies. However, for paths having non-deterministic latencies, the buffer sizes are estimated. When the estimate for a buffer is oversized, resources are wasted, and when the estimate for the buffer is undersized, performance issues result.

According to an embodiment of the present disclosure, profile data collecting hardware (monitors) are added to monitor operation of a system to identify an arrival rate associated with data transmitted to a buffer, and to identify a service rate of a service node associated with the buffer. According to an embodiment of the present disclosure, arrival rate is the estimated probability mass function for time between requests en-queued to a service node. "Work requests" arrive at a service node that can be modeled as a probability mass function. This may be achieved by storing condensed snapshots of inter-arrival times every time a request arrives at the service node. Once a sufficient sampling size has been gathered, arrival rates may be computed for the $10^{th}$, $25^{th}$, $50^{th}$, $75^{th}$, and $90^{th}$ percentile cases. According to an embodiment of the present disclosure, service rate is the amount of time taken to service a particular request. Service rate times may be sampled, stored, and used to create a probability mass function for service rates.

Each buffer may have profile data that may be used to construct a probability distribution for the collected metrics. Service rates and arrival rates may be determined from the probability distribution constructed for different frequencies of occurrence based on the goals for the design. For example, if buffers are required to be sized for a high percentage of arrivals, then an arrival time for a $90^{th}$ percentile would be selected by the user or compiler. These policies are controlled by options selected or indicated by the user based on the goals for the design, or based on known characteristics and tradeoffs selected by the compiler during the resize phase of compilation.

Measuring application performance through run-time metrics provides a user with a number of benefits. Some benefits include allowing the user to understand application characteristics and performance effects from real-world data sets. The measurements may also allow the user to identify performance bottlenecks and better guide optimizations. According to an embodiment of the present disclosure, the collected profile data is transmitted to a high-level compilation or hardware description language compilation procedure that analyzes the profile data to appropriately size a buffer. A user may also direct a sizing strategy implemented by the high-level compilation or hardware description language compilation procedure in response to information from the collected profile data.

FIG. 1A is a flow chart illustrating a method for designing a system on a target device according to an exemplary embodiment of the present disclosure. The target device may be a programmable logic device such as a field programmable gate array (FPGA), an application specific integrated circuit (ASIC), a structured ASIC, or other device whose functionality is described by a hardware description language (HDL). According to one embodiment, the procedure illustrated in FIG. 1 may be performed by one or more computer aided design CAD/EDA tools implemented on a computer system.

At 110, a high-level kernel description 105 is compiled into HDL 115. According to an embodiment of the present disclosure, the high-level kernel description 105 may be a computer program language (high-level) description of the system such as OpenCL or other language or format. During a first iteration of high-level compilation 110, when a user (designer) elects to enable instrumentation, hardware is added to the design of the system for collecting profile data. Profile data may be collected from the added hardware when the system is running as implemented on the target device.

At 120, the HDL 115 is compiled into a program file 125. According to an embodiment of the present disclosure, HDL compilation involves synthesis, placement, routing, and timing analysis. The program file 125 may be a bit stream that may be used to program the target device.

At 130, the target device is programmed using the program file 125 to implement the system. By programming the target device with the program file, components (programmable resources) on the target device are physically transformed to implement the system. According to an embodiment of the present disclosure, when the target device is a programmable logic device, the programmable resources may include components such as programmable logic blocks, and digital signal processor blocks that may be used to implement logic functions. The programmable resources may also include programmable routing that connects the logic functions. The program file 125 with configuration bit stream may be used to configure the programmable logic device using various programming technologies. For instance, an FPGA may utilize static random access memory (SRAM), flash, or antifuse-based programming technology to program the programmable resources. The SRAM-based programming technology uses static memory cells which are divided throughout the FPGA to configure routing interconnect which are steered by small multiplexers, and to configure logic blocks to implement logic functions. Similarly, flash-based programming technology uses floating-gate transistors in flash memory for configuration storage. Antifuse-based programming technology requires burning of antifuses to program resources. The antifuse-based programming technology allows for programming only once and FPGAs utilizing antifuse-based programming cannot be reprogrammed.

At 140, the target device is monitored while it is in operation. During the monitoring, the hardware added to the system may be used to collect profile data 145 while the system is running In an alternate embodiment of the present disclosure, instead of collecting hardware profile data 135 from a programmed target device that is running, profile data 145 is collected by executing the HDL or program file of the system on a simulator. In this embodiment, hardware need not be added during high-level compilation 110 to collect the profile data 145.

During a second or subsequent iteration of the high-level compilation 110, the profile data 145 is used to perform profile guided optimization of the design of the system. By performing profile guided optimization using profile data from an earlier compilation of the system, an improved HDL of the design of the system may be generated. According to an embodiment of the present disclosure, the profile data collected includes an average arrival rate associated with data transmitted to a buffer in the system, and an average service rate of a service node associated with the buffer. In this embodiment, profile guided optimization would determine a new size for the buffer from the average arrival rate associated with the data transmitted to the buffer and the average service rate of the service node associated with the buffer.

During the second or subsequent iteration of the high-level compilation 110, if the user elects to enable instrumentation, hardware is included to further collect profile data. Alternatively, if the user elects to disable instrumentation, hardware is not included to further collect profile data.

According to an embodiment of the present disclosure, the hardware profile data 145 may also or alternatively be transmitted to a user to provide the user with profiling feedback. At 150, the user may specify a percentile quantity of the profile data to guide the optimization procedure performed at 110.

Figure 1B:
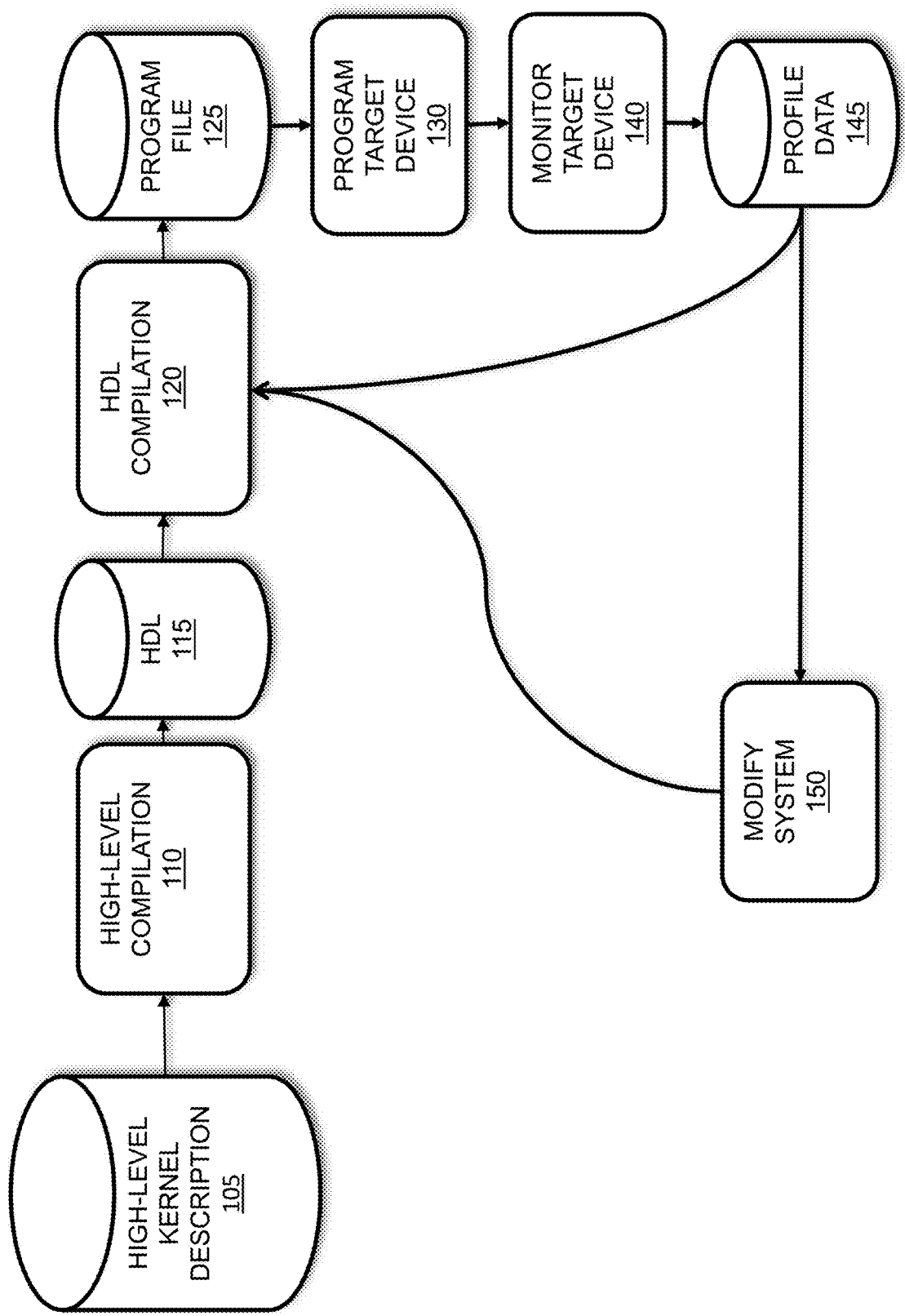
FIG. 1B is a flow chart illustrating a method for designing a system on a target device according to an alternate embodiment of the present disclosure.

FIG. 1B is a flow chart illustrating a method for designing a system on a target device according to an alternate embodiment of the present disclosure. The method illustrated in FIG. 1B is similar to the method illustrated in FIG. 1A with the exception that hardware is added to a design of the system for collecting profile data during HDL compilation 120 instead of during high-level compilation 110. Furthermore, during a second or subsequent iteration of HDL compilation 120, the profile data 145 is used to perform profile guided optimization of the design of the system instead of during a second or subsequent iteration of high-level compilation 110. By performing profile guided optimization using profile data from an earlier compilation of the system, an improved design of the system may be generated. According to an embodiment of the present disclosure, the profile data collected includes an average arrival rate associated with data transmitted to a buffer in the system, and an average service rate of a service node associated with the buffer. In this embodiment, profile guided optimization would determine a new size for the buffer from the average arrival rate associated with the data transmitted to the buffer and the average service rate of the service node associated with the buffer.

During the second or subsequent iteration of the HDL compilation 120, if the user elects to enable instrumentation, hardware is included to further collect profile data. Alternatively, if the user elects to disable instrumentation, hardware is not included to further collect profile data.

According to an embodiment of the present disclosure, the hardware profile data 145 may also or alternatively be transmitted to a user to provide the user with profiling feedback. At 150, the user may specify a percentile quantity of the profile data to guide the resizing of a buffer performed at 120.

Figure 2:
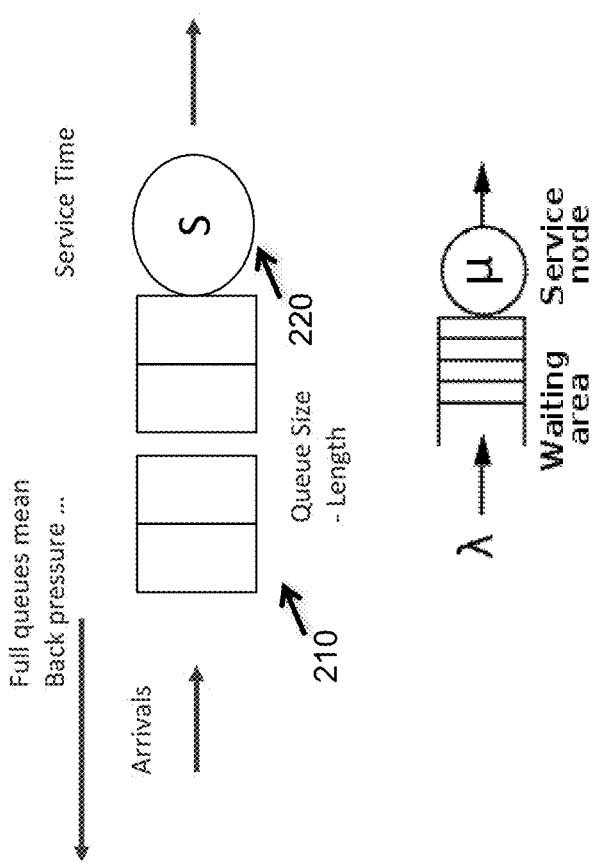
FIG. 2 illustrates a buffer and a service node implemented on a target device according to an exemplary embodiment of the present disclosure.

FIG. 2 illustrates a buffer 210 and a service node 220 implemented on a target device according to an exemplary embodiment of the present disclosure. According to one embodiment, the buffer 210 may be implemented with a first-in-first-out (FIFO). The buffer 210 is coupled to the service node 220 and receives and stores data to be processed by the service node 220. The buffer 210 includes a queue of size L. When the queue size of a buffer 210 is undersized and the queue is full, back pressure results and stalls occur on the path to the service node 220. Queue notation is utilized as an abstraction for an interconnect point. Each interconnect point includes a number of buffered "elements" or "work items", and a "service node". The service node 220 takes some amount of time to service each "element" or "work item". The time between "elements" or "work items" en-queued to a service node's buffer is defined to be the inter-arrival time.

According to an embodiment of the present disclosure, profile data may be collected to identify an arrival rate, $\lambda$, of data to the buffer 210, and the service rate, $\mu$, of the service node 220. From a probability distribution, the $50^{th}$ percentile of the arrival rate and service rate may be determined to identify an average arrival rate and service rate. From the arrival rate and service rate, a desired length of a queue size of the buffer, L, may be computed using the following relationship.

$$L=\lambda*\lambda/\mu*(\mu-\lambda)$$

In this example, if the arrival rate is 25,000/sec, and the service rate is 30,000/sec, the desired length of the buffer would be 4.16, which is then rounded up to the next whole integer, 5.

If the arrival rate and service rate for the $50^{th}$ percentile are used, the average of mean case is addressed for determining a queue size for the buffer 210. It should be appreciated that the user may use the collected profile data to determine a more conservative queue sizing by selecting a $90^{th}$ percentile of the arrival and service rate for example. Other percentiles may be considered and selected by the user for queue sizing of the buffer 210. It should also be appreciated that the desired length of the queue size of the buffer, L, may be computed using other relationships or methodologies.

Figure 3:
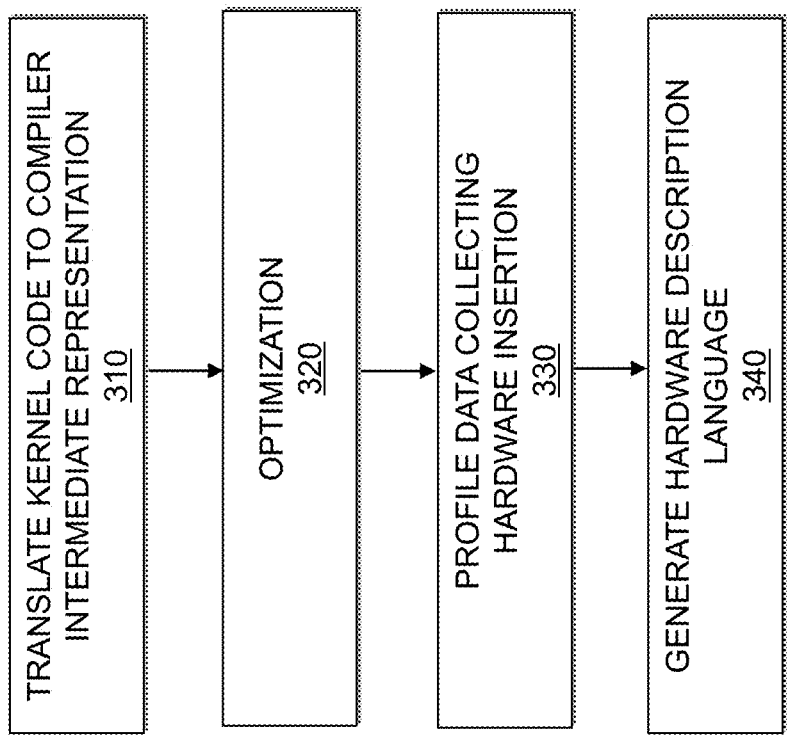
FIG. 3 is a flow chart illustrating a first iteration of performing high-level compilation according to an exemplary embodiment of the present disclosure.

FIG. 3 is a flow chart illustrating a method for performing a first iteration of high-level compilation according to an embodiment of the present disclosure. According to an embodiment of the present disclosure, the procedures shown in FIG. 3 may be used to implement procedure 110 (shown in FIG. 1A) in part. At 310, kernel code is translated to a compiler intermediate representation. According to an embodiment of the present disclosure, the compiler intermediate representation of the kernel code includes a sequence of functions. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. A barrier synchronization primitive is expressed as a function call to a special barrier function. The kernel code also includes a system description of the eventual hardware target system implemented. According to an embodiment of the present disclosure, the translation may be performed by a compiler front end.

At 320, the compiler intermediate representation is transformed and optimized by mapping it to hardware constructs. According to an embodiment of the present disclosure, a Static Single Assignment (SSA) is used to further restrict the compiler intermediate representation. In SSA, computed values are given a name, and the instruction that computes the value is referred to as the value's definition site. A value is computed so that it can be used by instructions that execute later in the program code, and each of those later instructions is known as a use of the value.

At 330, hardware is added to the system to collect profile data. According to an embodiment of the present disclosure, the hardware added is customized to collect profile data corresponding to a buffer associated with a service node and/or signals associated with characteristics of the system specified by a user.

At 340, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals.

Figure 4:
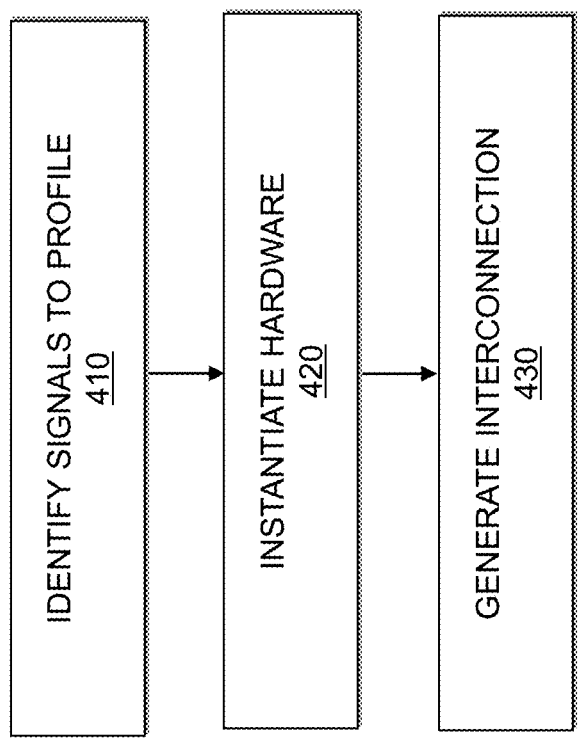
FIG. 4 is a flow chart illustrating a method for adding hardware during high-level compilation for collecting profile data according to an exemplary embodiment of the present disclosure.

FIG. 4 is a flow chart illustrating a method for adding hardware during high-level compilation for collecting profile data according to an exemplary embodiment of the present disclosure. According to an embodiment of the present disclosure, the procedures shown in FIG. 4 may be used to implement procedure 330 (shown in FIG. 3). At 410, buffers associated with service nodes and/or signals to profile are identified. The signals identified to be profiled may be selected in response to characteristics of a system selected by a user. For example, when a data path is selected as a characteristic of a system for profiling, signals that measure total clock cycles and stalls at critical points such as block and loop entry and exits may be profiled. When on-chip memory is selected as a characteristic of a system for profiling, signals that measure total request, arbitration stalls, bandwidth usage, and total bursts may be profiled. When channels are selected as a characteristic of a system for profiling, signals that measure first-in-first-out fill, read side stalls, write side stalls, and valid inputs may be profiled. When off-chip memory is selected as a characteristic for profiling, signals that measure a number of requests, average burst lengths, and read and write balance may be profiled.

It should be appreciated that the signals identified to be profiled may be selected automatically by a CAD/EDA tool in response to the characteristics of the system. Alternatively, the CAD/EDA tool may select a default set of signal types to profile associated with stallable events. It should also be appreciated that more than one characteristic of the system may be selected for profiling.

At 420, hardware for collecting profile data is instantiated. According to an embodiment of the present disclosure, for each buffer associated with a service node and/or signal identified to be profiled, a profiling counter is generated. A width of the profiling counter along with an appropriate amount for incrementing and other parameters may be set based upon the signal identified.

At 430, interconnections are generated for the hardware. Each buffer associated with a service node and/or signal identified is connected to the hardware for collecting profile data. For example, when a profiling counter is generated, the signal identified is connected to an enable input of the profiling counter. According to an embodiment of the present disclosure, nearby pipelined stages are connected to nearby counters to simplify and/or shorten routing. The order or path of interconnections may be based on a data path of a target device.

Figure 5:
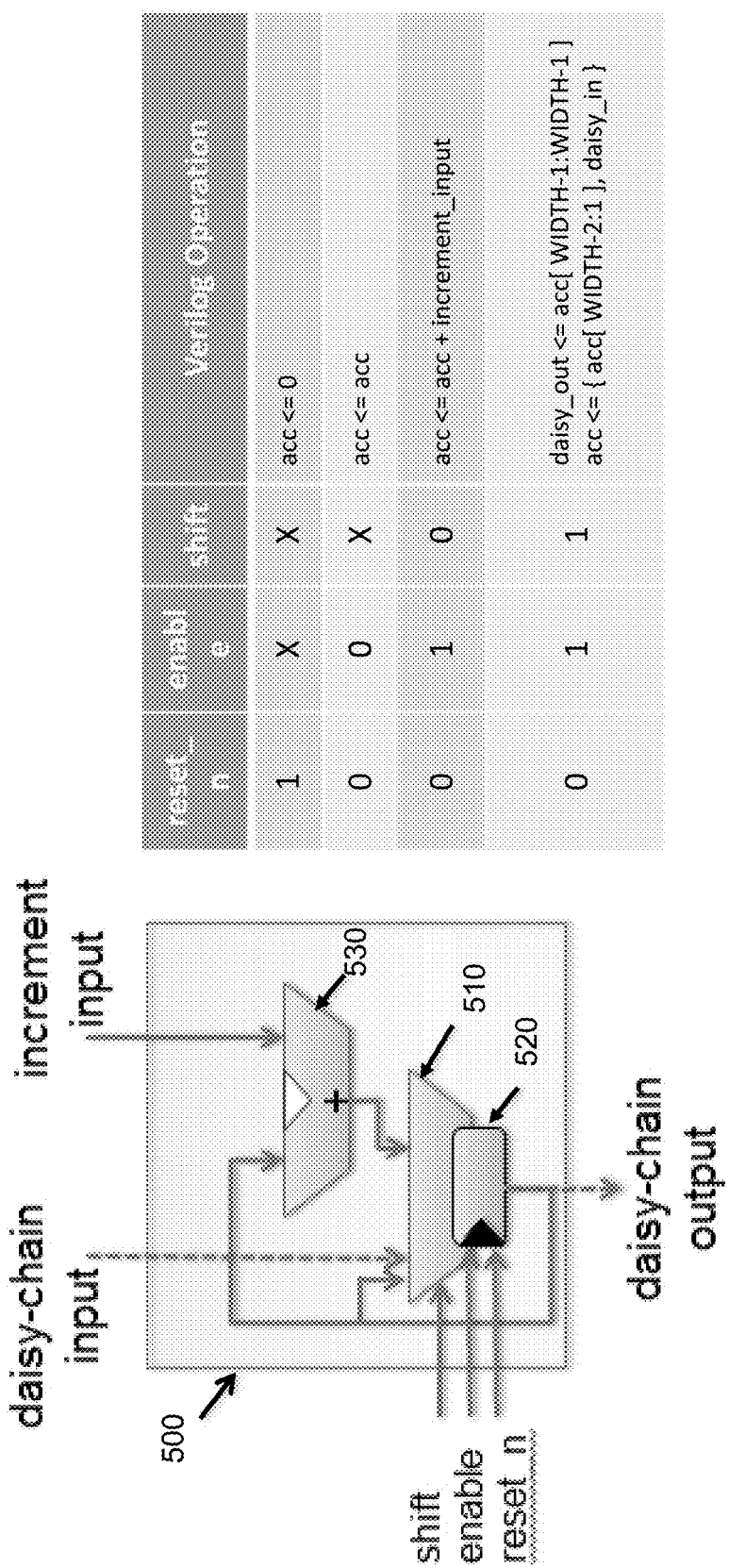
FIG. 5 illustrates a single hardware profiling counter according to an exemplary embodiment of the present disclosure.

FIG. 5 illustrates a single hardware profiling counter 500 according to an exemplary embodiment of the present disclosure. The profiling counter 500 includes a multiplexer 510, register 520, and an adder 530. The multiplexer 510 receives a daisy-chain input that may originate from another profiling counter (not shown) as a first input. The multiplexer 510 receives an output from the adder 530 as a second input. The register 520 stores the content output from the multiplexer 510. When this output originates from the adder 530, this may be designated as an accumulated value (acc). The adder 530 receives as a first input an output from the register 520. The adder 530 receives as a second input an increment signal. The adder 530 outputs the accumulated value.

The multiplexer 510 is coupled to a shift signal. The register 520 is coupled to a reset signal and an enable signal. When the reset signal is asserted (high), the register 520 resets the accumulated value to zero. When the enable signal is asserted and the shift signal is not asserted, the multiplexer 510 selects an input from the adder 530 and the register 520 stores the input from the adder 530. When both the enable signal and shift signal are asserted, the hardware profiling counter 500 outputs the bit stored in the most significant location of the register 520. The bits stored in register 520 are shifted from the least-significant location towards the most-significant location, and the daisy chain input is stored at the least-significant bit location of register 520.

The profiling counter 500 accumulates an increment input when enable is asserted. It should be appreciated that a variety of signals can be connected to the profiling counter 500. For example, the enable signal of the profiling counter 500 may be connected to a clock signal, memory stall signal, burst count signal, or other signals. The daisy-chain input and daisy-chain output signals of the profiling counter 500 may be connected to another profiling counter in a serial bitwise fashion.

Figure 6:
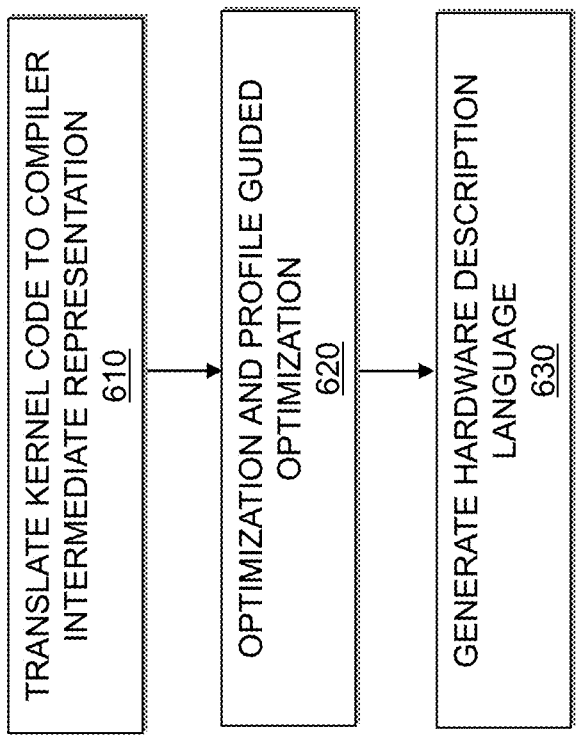
FIG. 6 is a flow chart illustrating a second or subsequent iteration of high-level compilation according to an exemplary embodiment of the present disclosure.

FIG. 6 is a flow chart illustrating a second or subsequent iteration of high-level compilation according to an embodiment of the present disclosure. According to an embodiment of the present disclosure, the procedures shown in FIG. 6 may be used to implement procedure 120 (shown in FIG. 1) in part.

At 610, kernel code is translated to a compiler intermediate representation. According to an embodiment of the present disclosure, the compiler intermediate representation of the kernel code includes a sequence of functions. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. A barrier synchronization primitive is expressed as a function call to a special barrier function. The kernel code also includes a system description of the eventual hardware target system implemented. According to an embodiment of the present disclosure, the translation may be performed by a compiler front end.

At 620, the compiler intermediate representation is transformed and optimized by mapping it to hardware constructs. In addition, profile guided optimization is performed using profile data associated with an earlier compilation of the design of the system. The profile data may include profile data from the earlier compiled system. According to an embodiment of the present disclosure, one or more buffers are resized in response to profile data collected from an earlier compilation of the design of the system. The profile data collected may include an arrival rate associated with data transmitted to a buffer, and service rate of a service node associated with the buffer.

At 630, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals.

Figure 7:
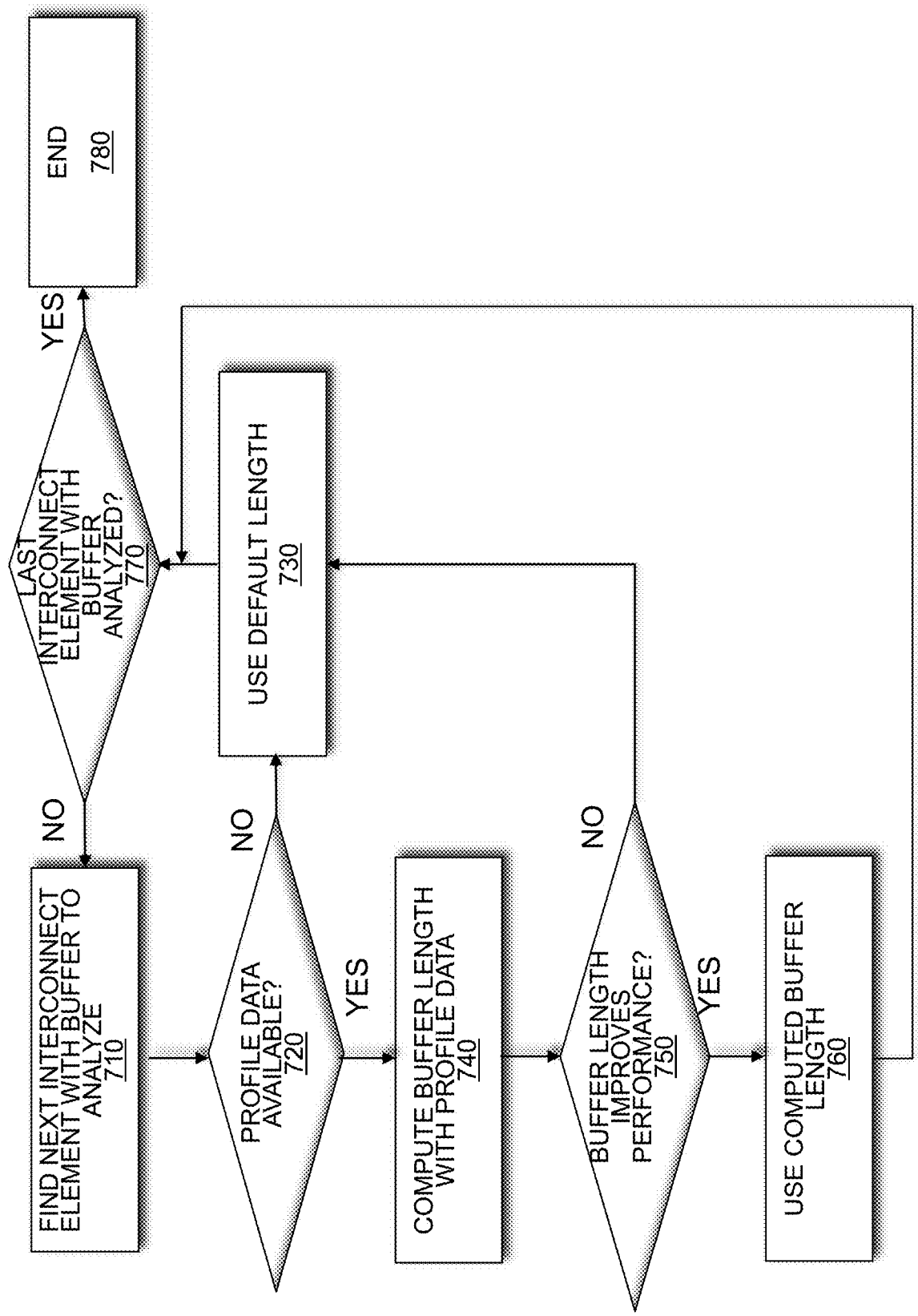
FIG. 7 is a flow chart illustrating a method for performing profile guided optimization according to an exemplary embodiment of the present disclosure.

FIG. 7 is a flow chart illustrating a method for performing profile guided optimization according to an exemplary embodiment of the present disclosure. The method illustrated in FIG. 7 may be utilized to perform procedure 620 (shown in FIG. 6) in part. At 710, a next interconnect element with a buffer to be monitored that has yet to be analyzed is identified.

At 720, it is determined whether profile data is available for the interconnect element with a buffer to be monitored. According to an embodiment of the present disclosure, the profile data includes an arrival rate associated with data transmitted to the buffer, $\lambda$, and a service rate, $\mu$, of a service node associated with the buffer. It should be appreciated that other types of profile data may be included. If profile data is not available for the interconnect element with a buffer to be monitored, control proceeds to 730. If profile data is available for the interconnect element with a buffer to be monitored, control proceeds to 740.

At 730, a default length for the buffer is assigned.

At 740, a length for the buffer is computed using the profile data.

At 750, it is determined whether the buffer length computed using the profile data improves performance of the system According to an embodiment of the present disclosure, the compiler may make a determination of optimal buffer length based on user controls. For example, the probability distribution may be used to size the buffers for 50% of cases encountered for the gathered data, or 90% of cases encountered for the gathered data. In the specific example of sizing buffers for 90% of the cases, the $90^{th}$ percentile numbers for arrival rate and service rate may be used to compute an optimal buffer size. In the specific example of sizing buffers for 50% of the cases, the $50^{th}$ percentile numbers for arrival rate and service rate are used. The compiler knows what values for buffer lengths were used prior to profile guided optimization, and will determine if a "default" value is better or worse than a value computed from the profile data. If it is determined that the buffer length computed using the profile data improves performance of the system, control proceeds to 760. If it is determined that the buffer length computed using the profile data does not improve performance of the system, control proceeds to 730.

At 760, the computed buffer length is used.

At 770, it is determined whether a last interconnect element with a buffer to be monitored has been analyzed. If the last interconnect element with a buffer to be monitored has not been analyzed, control returns to 710. If the last interconnect element with a buffer to be monitored has been analyzed, control proceeds to 780.

At 780, control terminates the procedure.

Figure 8:
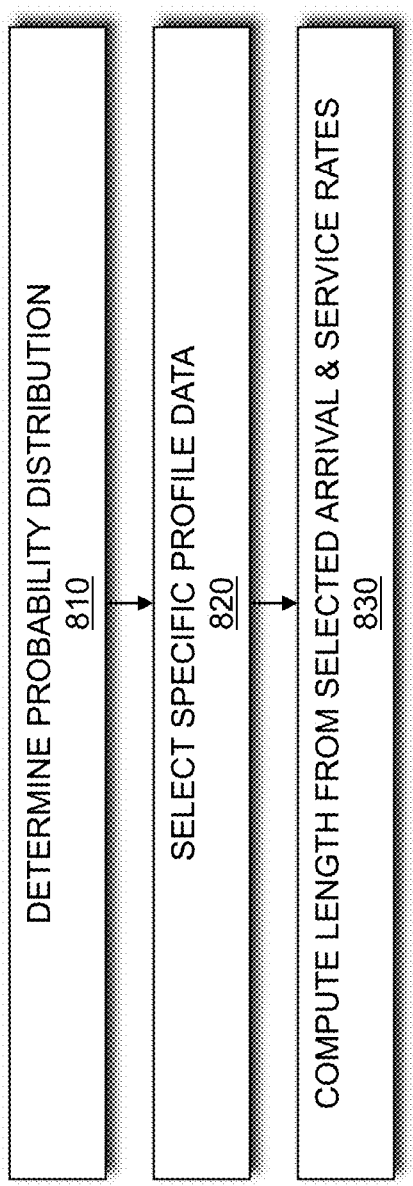
FIG. 8 is a flow chart illustrating a method for computing a buffer length with profile data according to an exemplary embodiment of the present disclosure.

FIG. 8 is a flow chart illustrating a method for computing a buffer length with profile data according to an exemplary embodiment of the present disclosure. The method illustrated in FIG. 8 may be utilized to perform procedure 740 (shown in FIG. 7). At 810, a probability distribution is determined for the profile data collected. According to an embodiment of the present disclosure, the profile data includes an arrival rate associated with data transmitted to the buffer, $\lambda$, and a service rate, $\mu$, of a service node associated with the buffer. The probability distribution may be used to identify what percentile of arrival rates/service rates observed over a period of time a particular arrival rate/service rate would cover. For example, the probability distribution may be used to size the buffers for 50% of cases encountered for the gathered data, or 90% of cases encountered for the gathered data. In the specific example of sizing buffers for 90% of the cases, the $90^{th}$ percentile numbers for arrival rate and service rate are used to compute an optimal buffer size. In the specific example of sizing buffers for 50% of the cases, the $50^{th}$ percentile numbers for arrival rate and service rate are used.

At 820, specific profile data is selected in response to input provided by a user. According to an embodiment of present disclosure, the arrival rate associated with data transmitted to the buffer and the service rate of a service node associated with the buffer are selected in response to input provided by a user. The user may indicate an interest in an average arrival rate and service rate, a more conservative arrival rate and service rate in the $90^{th}$ percentile that would reduce the likelihood of a sizing a buffer that would cause back pressure and stalls, or other arrival rate and service rate.

At 830, a length of the buffer (queue size of the buffer) is computed from the selected profile data. According to an embodiment of the present disclosure where the profile data includes an arrival rate associated with data transmitted to the buffer, $\lambda$, and a service rate, $\mu$, of a service node associated with the buffer, the length of the buffer, L, is computed as $L=\lambda*\lambda/\mu*(\mu-\lambda)$. It should be appreciated that the length of the buffer may be computed using other profile data and/or using other techniques.

Figure 9:
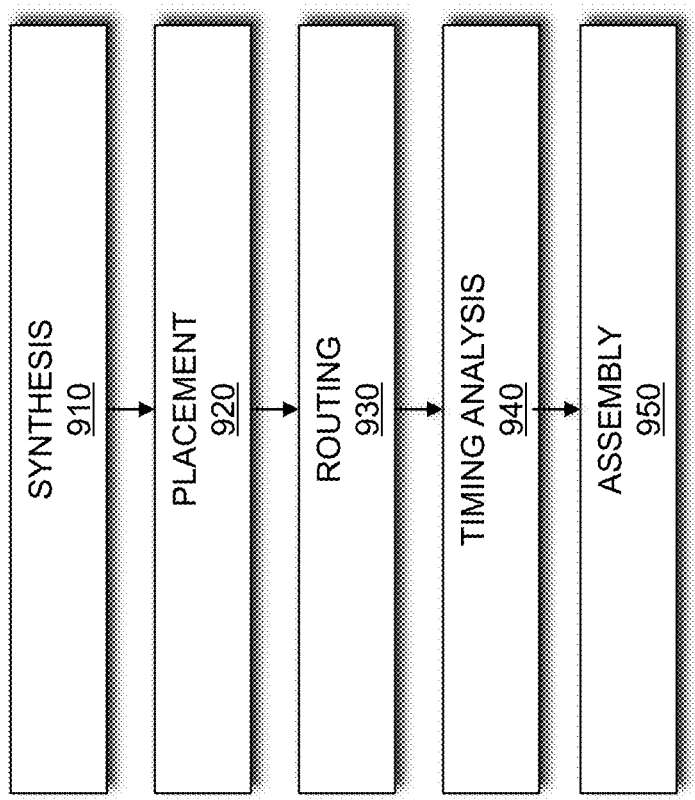
FIG. 9 is a flow chart illustrating a method for performing hardware description language compilation according to an exemplary embodiment of the present disclosure.

FIG. 9 is a flow chart illustrating a method for performing HDL compilation according to an embodiment of the present disclosure. According to an embodiment of the present disclosure, the procedures illustrated in FIG. 9 may be used to implement procedure 120 shown in FIG. 1A. At 910, the system is synthesized. Synthesis includes generating a logic design of the system to be implemented by the target device. According to an embodiment of the present disclosure, synthesis generates an optimized logical representation of the system from an HDL design definition. Synthesis also includes mapping the optimized logic design. Mapping includes determining how to implement logic gates and logic elements in the optimized logic representation with specific resources on the target device such as logic elements and functional blocks. According to an embodiment of the present disclosure, a netlist is generated from mapping. This netlist may be an optimized technology-mapped netlist generated from the HDL.

At 920, the system is placed. According to an embodiment of the present disclosure, placement involves placing the mapped logical system design on the target device. Placement works on the technology-mapped netlist to produce a placement for each of the logic elements and functional blocks. According to an embodiment of the present disclosure, placement includes fitting the system on the target device by determining which resources on the target device are to be used to implement the logic elements and functional blocks identified during synthesis. Placement may include clustering which involves grouping logic elements together to form the logic clusters present on the target device. According to an embodiment of the present disclosure, clustering is performed at an early stage of placement and occurs directly after synthesis during the placement preparation stage.

At 930, the placed design is routed. During routing, routing resources on the target device are allocated to provide interconnections between logic gates, logic elements, and other components on the target device. Routability optimization may also be performed on the placed logic design. According to an embodiment of the present disclosure, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 940, timing analysis is performed on the system designed by procedures 910, 920, and 930. According to an embodiment of the present disclosure, the timing analysis determines whether timing constraints of the system are satisfied. As part of timing analysis, slack analysis may be performed. It should be appreciated that the design for the system may be modified in response to the timing analysis. According to an embodiment of the present disclosure, the design for the system may be modified in response to determining that timing constraints have not been satisfied. The design for the system may be modified by a designer manually or alternatively the design may be modified automatically by the EDA tool by re-executing one or more of procedures 910, 920, and 930. It should also be appreciated that each procedure may perform this optimization in its first invocation by performing the analysis during its execution. Timing analysis 940 may also be performed after the system is modified to collect statistics of the modified design of the system.

At 950, an assembly procedure is performed. The assembly procedure involves creating a program file that includes information determined by the procedures described at 910, 920, 930, 940, and 950. The program file may be a bit stream that may be used to program a target device. According to an embodiment of the present disclosure, the procedures illustrated in FIG. 9 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

According to an embodiment of the present disclosure, the procedures illustrated in FIG. 9 may also be used to implement procedure 120 shown in FIG. 1B. In this embodiment, procedure 330 illustrated in FIG. 3, and the method for adding hardware during high-level compilation for collecting profile data illustrated in FIG. 4 may be implemented during synthesis 910 during a first iteration of HDL compilation 120 instead of during a first iteration of high-level compilation 110. Furthermore, the method for performing profile guided optimization illustrated in FIGS. 6 and 7 may be implemented during synthesis 910 during a second or subsequent iteration of HDL compilation 120 instead of during a second or subsequent iteration of high-level compilation 110.

FIGS. 1A-1B, 3-4, and 6-9 are flow charts that illustrate embodiments of the present disclosure. The procedures described in these figures may be performed by an EDA tool implemented by one or more computer systems. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 10:
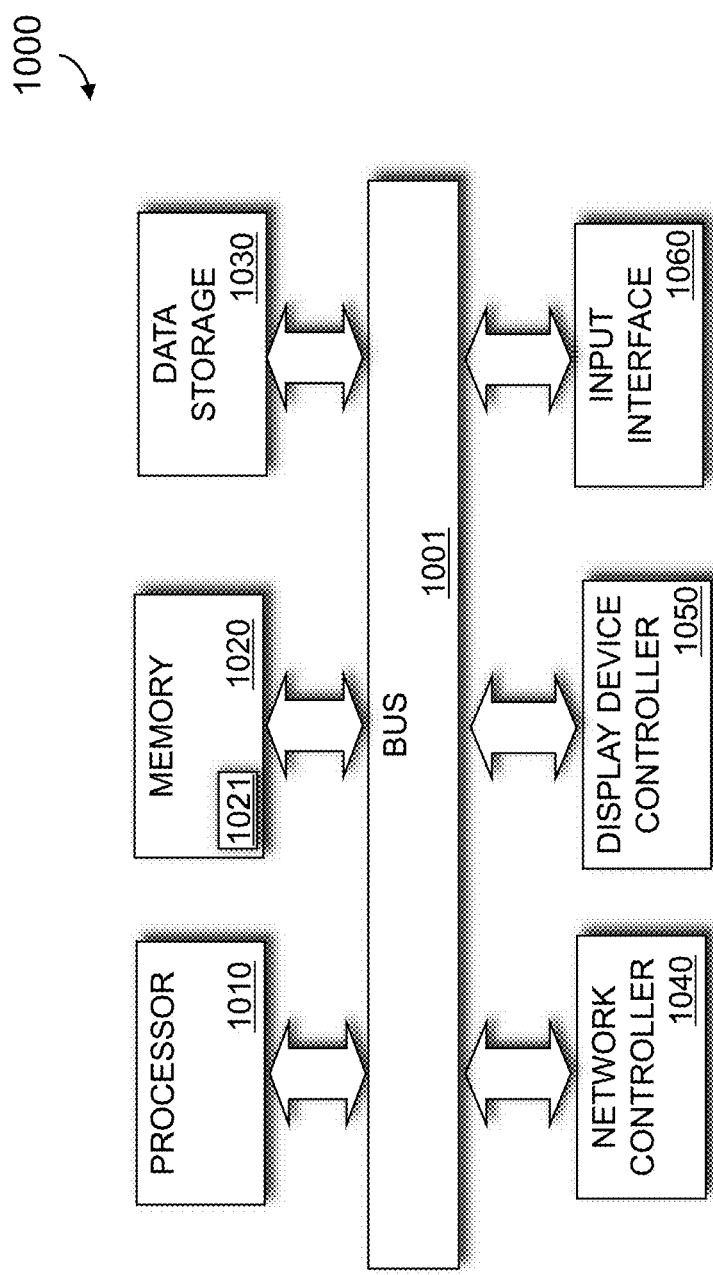
FIG. 10 illustrates a block diagram of a computer system implementing a system designer according to an exemplary embodiment of the present disclosure.

FIG. 10 is a block diagram of an exemplary computer system 1000 in which an example embodiment of the present disclosure resides. The computer system 1000 includes a processor 1010 that process data signals. The processor 1010 is coupled to a bus 1001 or other switch fabric that transmits data signals between processor 1010 and other components in the computer system 1000. The computer system 1000 includes a memory 1020. The memory 1020 may store instructions and code represented by data signals that may be executed by the processor 1010. A data storage device 1030 is also coupled to the bus 1001.

A network controller 1040 is coupled to the bus 1001. The network controller 1040 may link the computer system 1000 to a network of computers (not shown) and supports communication among the machines. A display device controller 1050 is coupled to the bus 1001. The display device controller 1050 allows coupling of a display device (not shown) to the computer system 1000 and acts as an interface between the display device and the computer system 1000. An input interface 1060 is coupled to the bus 1001. The input interface 1060 allows coupling of an input device (not shown) to the computer system 1000 and transmits data signals from the input device to the computer system 1000.

A system designer 1021 may reside in the memory 1020 and be executed by the processor 1010. The system designer 1021 may operate to perform high-level compilation, HDL compilation, program a target device, and solicit feedback to either the high-level or HDL compilation. During a first iteration of high-level compilation or HDL compilation, the system designer 1021 may insert hardware used for collecting hardware profile data. The insertion of hardware for collecting hardware profile data may include identifying a buffer and a service node and/or signals to profile in a system, and generating hardware in an HDL of the system in response to the buffer and service node and/or the signals identified. During a second iteration of the high-level or HDL compilation, the system designer may perform profile guided optimization utilizing hardware profile data collected for an earlier compilation of the system.

Figure 11:
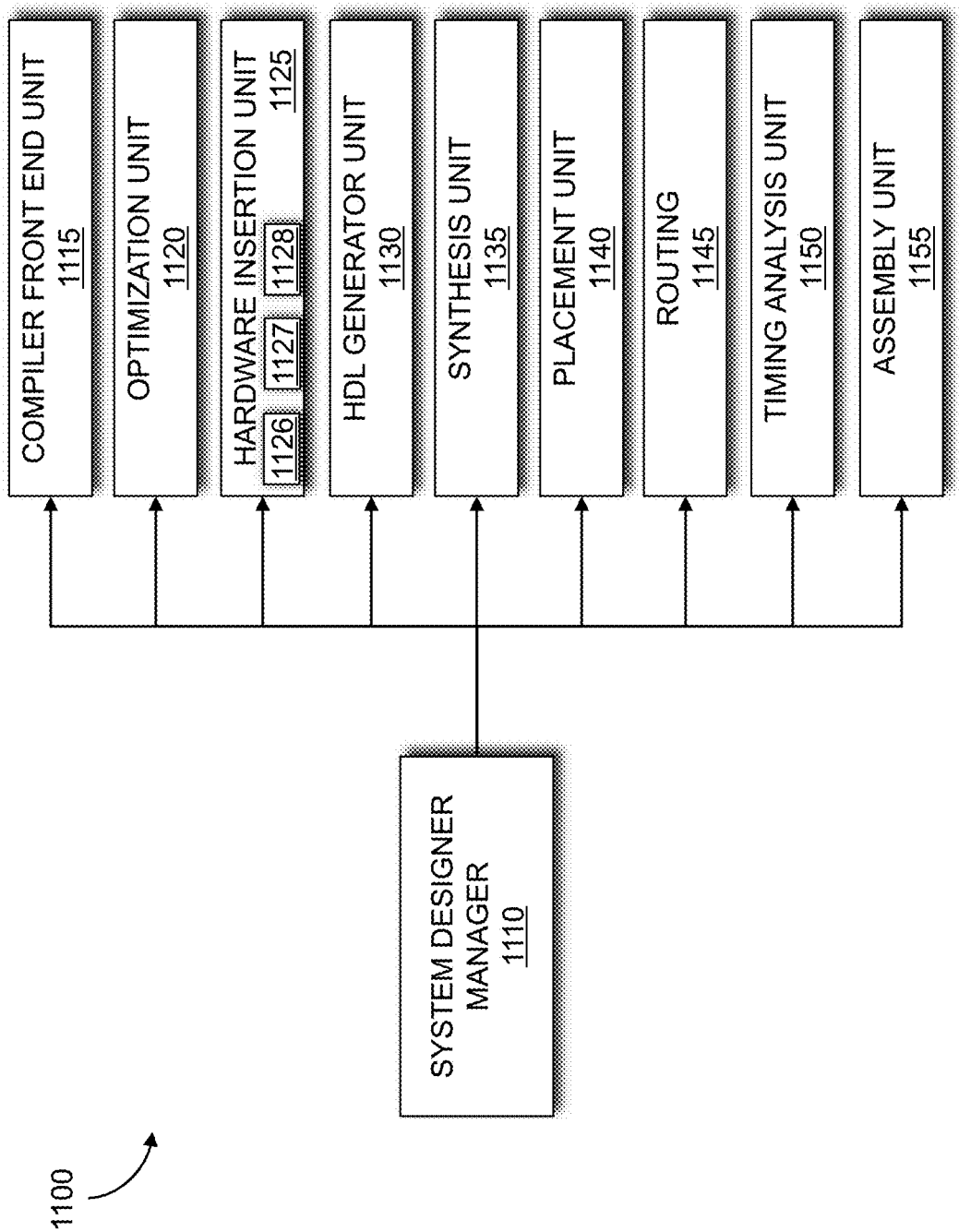
FIG. 11 is a block diagram of a system designer according to an exemplary embodiment of the present disclosure.

FIG. 11 illustrates a system designer 1100 according to an embodiment of the present disclosure. The system designer 1100 may be an EDA tool for designing a system on a target device such as an FPGA, structured application-specific integrated circuit (ASIC), ASIC, or other circuitry. FIG. 11 illustrates modules implementing an embodiment of the system designer 1100. According to one embodiment, the modules represent software modules and system design may be performed by a computer system such as the one illustrated in FIG. 10 executing sequences of instructions represented by the modules shown in FIG. 11. Execution of the sequences of instructions causes the computer system to support system design as will be described hereafter. In alternate embodiments, hard-wire circuitry may be used in place of or in combination with software instructions to implement embodiments of present disclosure. Thus, embodiments of present disclosure are not limited to any specific combination of hardware circuitry and software.

The system designer 1100 includes a system designer manager 1110. The system designer manager 1110 is connected to and transmits data between the components of the system designer 1100.

The system designer 1100 includes a compiler front end unit 1115. The compiler front end unit 1115 receives kernel code, which is a computer language description of the system, and translates the kernel code to a compiler intermediate representation.

The system designer 1100 includes an optimization unit 1120. The optimization unit 1120 transforms and optimizes the compiler intermediate representation by mapping it to hardware constructs. During a during a second or subsequent iteration of high-level compilation, the optimization unit 1120 utilizes profile data of an earlier compilation of the system to perform profile guided optimizations as described with reference to FIG. 6. According to an embodiment of the present disclosure, the profile data may include profile data collected from operation of the system as implemented on a target device and/or program files describing aspects of the system after timing analyzing.

The system designer 1100 includes a hardware insertion unit 1125. The hardware insertion unit 1125 adds hardware to the system to collect profile data when the system is implemented on a target device and in operation. According to an embodiment of the present disclosure, the hardware is added during high-level compilation after a high-level kernel description of the system is generated and prior to a HDL compilation of the system. According to an alternate embodiment of the present disclosure, the hardware is added at synthesis during HDL compilation. The hardware insertion unit 1125 includes an identification unit 1126. The identification unit 1126 identifies a buffer and associated service node and/or signals to be profiled. According to an embodiment of the present disclosure, the signals may be selected in response to characteristics of a system selected by a user. The signals identified to be profiled may also or alternatively be selected automatically in response to the characteristics of the system or in response to stallable events. The hardware insertion unit 1125 includes a hardware generation unit 1127. The hardware generation unit 1127 instantiates hardware for collecting profile data. According to an embodiment of the present disclosure, for each buffer and associated service node and/or signal identified to be profiled, the hardware generation unit 1127 generates a profiling counter. A width of the profiling counter along with an appropriate amount to increment and other parameters may be set based upon the signal identified. The hardware insertion unit 1125 includes an interconnection unit 1128. The interconnection unit 1128 generates interconnection for the hardware for collecting profile data. The signal identified is connected to the hardware for collecting profile data. For example, when a profiling counter is generated, the signal identified is connected to an enable of the profiling counter. According to an embodiment of the present disclosure, nearby hardware blocks are connected to nearby counters to simplify routing. The order of generating interconnections may be based on a data path of a target device. The hardware insertion unit 1125 may generate the profiling counter described with reference to FIG. 5.

The system designer 1100 includes a HDL generator unit 1230. The HDL generator generates HDL for the design of the system. The HDL describes the operation of the system to be programmed on the target device. The HDL description provides high-level representations of a circuit in terms of the flow of signals (or transfer of data) between hardware registers, and the logic operations performed on those signals.

The system designer 1100 includes a synthesis unit 1135 that performs synthesis. The synthesis unit 1135 generates a logic design of a system to be implemented on the target device. According to an embodiment of the system designer 1100, the synthesis unit 1135 takes a conceptual HDL design definition and generates an optimized logical representation of the system. The optimized logical representation of the system generated by the synthesis unit 1135 may include a representation that has a reduced number of functional blocks and registers, such as logic gates and logic elements, required for the system. Alternatively, the optimized logical representation of the system generated by the synthesis unit 1135 may include a representation that has a reduced depth of logic and that generates a lower signal propagation delay.

The synthesis unit 1135 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (IO) elements or other components.

The system designer 1100 includes a placement unit 1140 that processes the optimized technology-mapped netlist to produce a placement for each of the functional blocks. The placement identifies which components or areas on the target device are to be used for specific functional blocks and registers.

The system designer 1100 includes a routing unit 1145 that performs routing. The routing unit 1145 determines the routing resources on the target device to use to provide interconnection between the components implementing functional blocks and registers of the logic design.

The system designer 1100 includes a timing analysis unit 1150 that performs timing analysis to determine whether timing constraints of the system are satisfied. The timing analysis unit 1150 may generate report files which identify the area required for implementing the system on the target device, the largest slack value for a path in a section of the system, and other statistics.

The system designer 1100 includes an assembly unit 1155 that performs an assembly procedure that creates a data file that includes the design of the system generated by the system designer 1100. The data file may be a bit stream that may be used to program the target device. The assembly unit 1155 may output the data file so that the data file may be stored or alternatively transmitted to a separate machine used to program the target device. It should be appreciated that the assembly unit 1155 may also output the design of the system in other forms such as on a display device or other medium.

It should be appreciated that embodiments of the present disclosure may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 12:
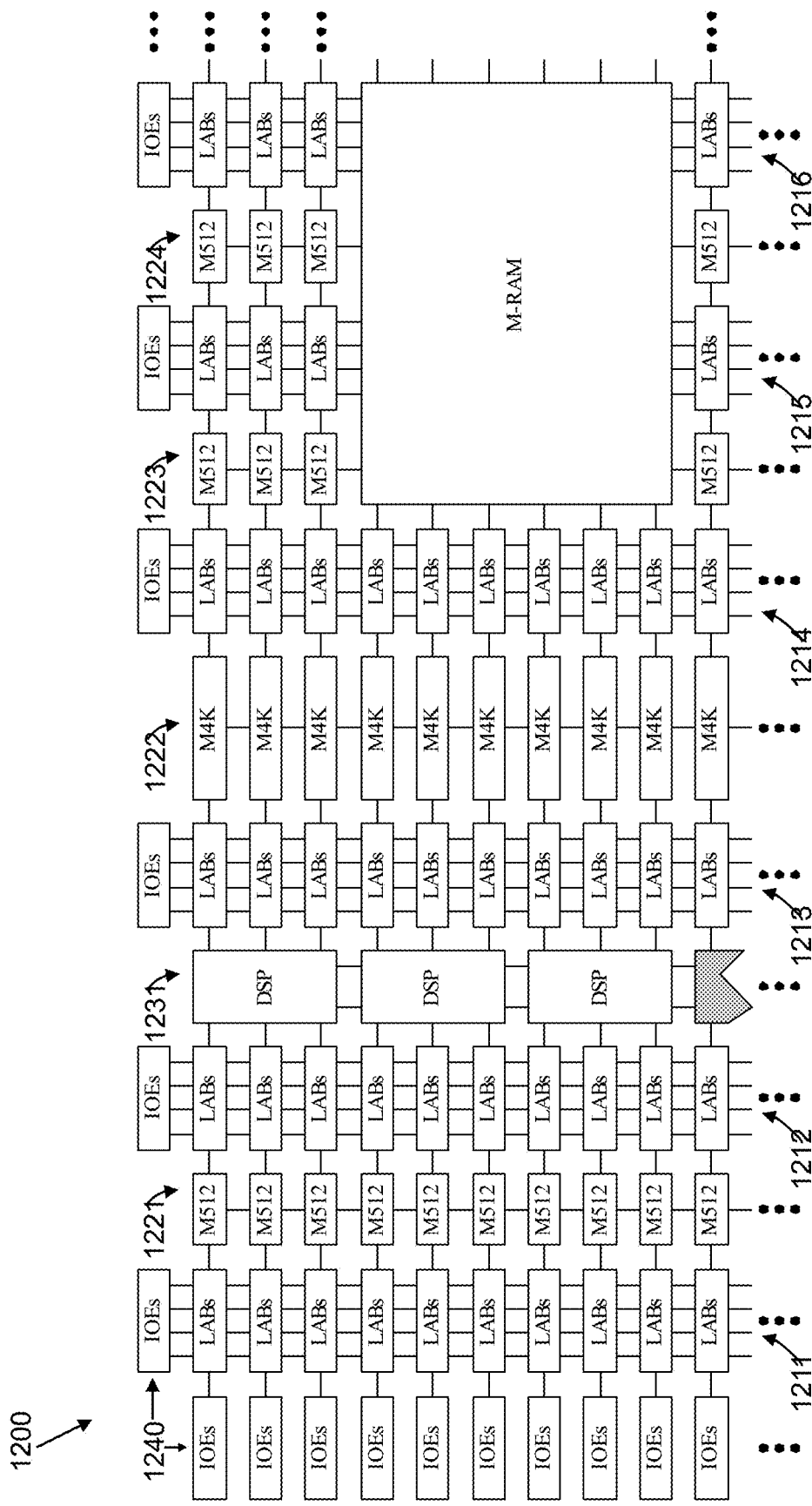
FIG. 12 illustrates an exemplary target device according to an exemplary embodiment of the present disclosure.

FIG. 12 illustrates a device 1200 that may be used to implement a target device according to an embodiment of the present disclosure. The device 1200 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present disclosure, the logic block may operate similarly to a logic element (LE), such as those found in the Stratix or Cyclone devices manufactured by Intel Corporation, or a combinational logic block (CLB) such as those found in Virtex devices manufactured by Xilinx Inc. In this embodiment, the logic block may include a four input LUT with a configurable register. According to an alternate embodiment of the present disclosure, the logic block may operate similarly to an adaptive logic module (ALM), such as those found in Stratix devices manufactured by Intel Corporation. LABs are grouped into rows and columns across the device 1200. Columns of LABs are shown as 1211-1216. It should be appreciated that the logic block may include additional or alternate components.

The device 1200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1200. Columns of memory blocks are shown as 1221-1224.

The device 1200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1200 and are shown as 1231.

The device 1200 includes a plurality of input/output elements (IOEs) 1240. Each IOE feeds an IO pin (not shown) on the device 1200. The IOEs 1240 are located at the end of LAB rows and columns around the periphery of the device 1200. Each IOE may include a bidirectional IO buffer and a plurality of registers for registering input, output, and output-enable signals.

The device 1200 may include routing resources such as LAB local interconnect lines, row interconnect lines ("H-type wires"), and column interconnect lines ("V-type wires") (not shown) to route signals between components on the target device.

The following examples pertain to further embodiments. In one embodiment, a method for designing a system on a target device, comprises generating a hardware description language (HDL) representation of profile data collecting hardware for a HDL of the system during a high-level compilation to collect profile data that includes an arrival rate associated with data transmitted to a buffer and a service rate of a service node associated with the buffer, compiling the HDL of the system to generate a data file that describes a synthesis, placement and routing of the system on the target device, and programming the target device with the data file to physically transform components on the target device to implement the system.

In a further embodiment, the method further comprising collecting the profile data by executing the system on the target device.

In a further embodiment, the method further comprising collecting the profile data by executing a simulation of the system.

In a further embodiment, the method further comprising determining a new size for the buffer from the arrival rate associated with data transmitted to the buffer and the service rate of the service node associated with the buffer.

In a further embodiment, the method wherein the new size for the buffer is determined to be $\lambda*\lambda/\mu(\mu-\lambda)$, wherein $\lambda$ is the arrival rate associated with data transmitted to the buffer, and $\mu$ is the service rate of a service node associated with the buffer.

In a further embodiment, the method further comprising modifying the system to implement the new size for the buffer by modifying the HDL of the system during a subsequent high-level compilation.

In a further embodiment, the method further comprising determining whether performance of the system is satisfactory with the new size for the buffer, and determining another new size for the buffer from a new arrival rate associated with data transmitted to the buffer and a new service rate of the service node associated with the buffer.

In a further embodiment, the method further comprising determining whether performance of the system is satisfactory with the new size for the buffer, and generating an HDL of the system without the HDL representation of profile data collecting hardware in response to determining that performance of the system is satisfactory.

In a further embodiment, the method further comprising determining a probability distribution for the arrival rate associated with data transmitted to the buffer and a probability distribution for the service rate of the service node associated with the buffer, selecting a specific arrival rate and service rate from the probability distributions in response to input received from a user, and determining a new size for the buffer from the specific arrival rate selected and the specific service rate selected.

In a further embodiment, a method for designing a system on a target device comprising adding a hardware description language (HDL) representation of profile data collecting hardware to an HDL of the system, during synthesis of the system on the target device, to collect profile data associated with a buffer and a service node connected to the buffer, placing the system on the target device, routing the system on the target device, generating a data file that reflects the synthesis, placing, and routing of the system on the target device, and programming the target device with the data file to physically transform components on the target device to implement the system.

In a further embodiment, the method wherein the profile data includes an arrival rate associated with data transmitted to the buffer and a service rate of the service node connected to the buffer.

In a further embodiment, the method further comprising collecting the profile data by executing the system on the target device.

In a further embodiment, the method further comprising collecting the profile data by executing a simulation of the system.

In a further embodiment, the method further comprising determining a new size for the buffer from the arrival rate associated with data transmitted to the buffer and the service rate of the service node associated with the buffer.

In a further embodiment, the method further comprising determining a probability distribution for the arrival rate associated with data transmitted to the buffer and a probability distribution for the service rate of the service node associated with the buffer, selecting a specific arrival rate and service rate from the probability distributions in response to input received from a user, and determining a new size for the buffer from the specific arrival rate selected and the specific service rate selected.

In a further embodiment, the method wherein the new size for the buffer is determined to be $\lambda*\lambda/\mu*(\mu-\lambda)$, wherein $\lambda$ is the arrival rate associated with data transmitted to the buffer, and $\mu$ is the service rate of a service node associated with the buffer.

In a further embodiment, the method further comprising modifying the system to implement the new size for the buffer by modifying the HDL of the system during a subsequent HDL compilation.

In a further embodiment, the method further comprising determining whether performance of the system is satisfactory with the new size for the buffer, and determining another new size for the buffer from a new average arrival rate associated with data transmitted to the buffer and a new average service rate of the service node associated with the buffer.

In a further embodiment, the method further comprising determining whether performance of the system is satisfactory with the new size for the buffer, and synthesizing the system without adding the HDL representation of profile data collecting hardware in response to determining that performance of the system is satisfactory.

In a further embodiment, a non-transitory computer readable medium including a sequence of instructions stored thereon for causing a computer to execute a method for designing a system on a target device, comprising generating a hardware description language (HDL) representation of profile data collecting hardware for a HDL of the system during a high-level compilation to collect profile data that includes an arrival rate associated with data transmitted to a buffer and a service rate of a service node associated with the buffer, determining a probability distribution for the arrival rate associated with data transmitted to the buffer and a probability distribution for the service rate of the service node associated with the buffer, selecting a specific arrival rate and service rate from the probability distributions in response to input received from a user, and determining a new size for the buffer from the specific arrival rate selected and the specific service rate selected.

In a further embodiment, the non-transitory computer readable medium wherein the new size for the buffer is determined to be $\lambda*\lambda/\mu*(\mu-\lambda)$, wherein $\lambda$ is the specific arrival rate selected, and $\mu$ is the specific service rate selected.

In a further embodiment, the non-transitory computer readable medium further comprising determining whether performance of the system is satisfactory with the new size for the buffer, and determining another new size for the buffer from a new specific arrival rate and a new specific service rate.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. A method for designing a system on a target device, comprising:
   generating a hardware description language (HDL) representation of profile data collecting hardware for a HDL of the system during a high-level compilation to collect profile data that includes an arrival rate associated with data transmitted to a buffer and a service rate of a service node associated with the buffer;
   compiling the HDL of the system to generate a data file that describes a synthesis, placement and routing of the system on the target device;
   programming the target device with the data file to physically transform components on the target device to implement the system;
   determining a probability distribution for the arrival rate associated with data transmitted to the buffer and a probability distribution for the service rate of the service node associated with the buffer;
   selecting a specific arrival rate and a specific service rate from the probability distributions in response to input received from a user; and
   determining a new size for the buffer based on the specific arrival rate selected and the specific service rate selected.

2. The method of claim 1 further comprising collecting the profile data by executing the system on the target device.

3. The method of claim 1 further comprising collecting the profile data by executing a simulation of the system.

4. The method of claim 1 further comprising modifying the system to implement the new size for the buffer by modifying the HDL of the system during a subsequent high-level compilation.

5. A method for designing a system on a target device, comprising:
   generating a hardware description language (HDL) representation of profile data collecting hardware for a HDL of the system during a high-level compilation to collect profile data that includes an arrival rate associated with data transmitted to a buffer and a service rate of a service node associated with the buffer;
   compiling the HDL of the system to generate a data file that describes a synthesis, placement and routing of the system on the target device;
   programming the target device with the data file to physically transform components on the target device to implement the system; and
   determining a new size for the buffer based on the arrival rate associated with data transmitted to the buffer and the service rate of the service node associated with the buffer,
   wherein the new size for the buffer is determined to be $\lambda*\lambda/\mu*(\mu-\lambda)$, wherein $\lambda$, is the arrival rate associated with data transmitted to the buffer, and $\mu$ is the service rate of the service node associated with the buffer.

6. The method of claim 5 further comprising modifying the system to implement the new size for the buffer by modifying the HDL of the system during a subsequent high-level compilation.

7. The method of claim 5 further comprising:
   determining whether performance of the system is satisfactory with the new size for the buffer; and
   determining another new size for the buffer based on a new arrival rate associated with data transmitted to the buffer and a new service rate of the service node associated with the buffer.

8. The method of claim 5 further comprising:
   determining whether performance of the system is satisfactory with the new size for the buffer; and
   generating the HDL of the system without the HDL representation of profile data collecting hardware in response to determining that performance of the system is satisfactory.

9. The method of claim 5 further comprising:
   determining a probability distribution for the arrival rate associated with data transmitted to the buffer and a probability distribution for the service rate of the service node associated with the buffer; and
   selecting a specific arrival rate and a specific service rate from the probability distributions in response to input received from a user,
   wherein determining the new size for the buffer further comprises determining the new size for the buffer based on the specific arrival rate selected and the specific service rate selected.

10. A method for designing a system on a target device, comprising:
    adding a hardware description language (HDL) representation of profile data collecting hardware to an HDL of the system, during synthesis of the system on the target device, to collect profile data associated with a buffer and a service node connected to the buffer, wherein the profile data comprises an arrival rate associated with data transmitted to the buffer and a service rate of the service node connected to the buffer;
    placing the system on the target device;
    routing the system on the target device;
    generating a data file that reflects the synthesis, placing, and routing of the system on the target device;
    programming the target device with the data file to physically transform components on the target device to implement the system;
    determining a probability distribution for the arrival rate associated with data transmitted to the buffer and a probability distribution for the service rate of the service node connected to the buffer;

selecting a specific arrival rate and a specific service rate from the probability distributions in response to input received from a user; and determining a new size for the buffer based on the specific arrival rate selected and the specific service rate selected.

11. The method of claim 10, wherein the target device is a field programmable gate array.

12. The method of claim 10 further comprising collecting the profile data by executing the system on the target device.

13. The method of claim 10 further comprising collecting the profile data by executing a simulation of the system.

14. The method of claim 10, wherein the new size for the buffer is determined to be $\lambda*\lambda/\mu*(\mu-\lambda)$, wherein $\lambda$ is the arrival rate associated with data transmitted to the buffer, and $\mu$ is the service rate the service node connected to the buffer.

15. The method of claim 10 further comprising modifying the system to implement the new size for the buffer by modifying the HDL of the system during a subsequent HDL compilation.

16. The method of claim 10 further comprising:
determining whether performance of the system is satisfactory with the new size for the buffer; and
determining another new size for the buffer based on a new average arrival rate associated with data transmitted to the buffer and a new average service rate of the service node connected to the buffer.

17. The method of claim 10 further comprising:
determining whether performance of the system is satisfactory with the new size for the buffer; and
synthesizing the system without adding the HDL representation of profile data collecting hardware in response to determining that performance of the system is satisfactory.

18. A non-transitory computer readable medium including a sequence of instructions stored thereon for causing a computer to execute a method for designing a system on a target device, the method comprising:
generating a hardware description language (HDL) representation of profile data collecting hardware for a HDL of the system during a high-level compilation to collect profile data that includes an arrival rate associated with data transmitted to a buffer and a service rate of a service node associated with the buffer;

determining a probability distribution for the arrival rate associated with data transmitted to the buffer and a probability distribution for the service rate of the service node associated with the buffer;

selecting a specific arrival rate and a specific service rate from the probability distributions in response to input received from a user; and determining a new size for the buffer based on the specific arrival rate selected and the specific service rate selected.

19. The non-transitory computer readable medium of claim 18, wherein the new size for the buffer is determined to be $\lambda*\lambda/\mu*(\mu-\lambda)$, wherein $\lambda$ is the specific arrival rate selected, and $\mu$ is the specific service rate selected.

20. The non-transitory computer readable medium of claim 19, wherein the method further comprises:
determining whether performance of the system is satisfactory with the new size for the buffer; and
determining another new size for the buffer based on a new specific arrival rate and a new specific service rate.

21. The non-transitory computer readable medium of claim 18, wherein the method further comprises:
modifying the system to implement the new size for the buffer by modifying the HDL of the system during a subsequent HDL compilation.

22. The non-transitory computer readable medium of claim 18, wherein the method further comprises:
determining whether performance of the system is satisfactory with the new size for the buffer; and
synthesizing the system without adding the HDL representation of profile data collecting hardware in response to determining that performance of the system is satisfactory.

* * * * *